United States Patent
Mishima et al.

(10) Patent No.: US 7,915,843 B2
(45) Date of Patent: Mar. 29, 2011

(54) MOTOR DRIVE DEVICE, METHOD, AND COOLING DEVICE USING THE SAME

(75) Inventors: Tomofumi Mishima, Kyoto (JP); Satoshi Miyajima, Kyoto (JP)

(73) Assignee: Rohm Co., Ltd. (JP)

( * ) Notice: Subject to any disclaimer, the term of this patent is extended or adjusted under 35 U.S.C. 154(b) by 415 days.

(21) Appl. No.: 12/064,311

(22) PCT Filed: Aug. 23, 2006

(86) PCT No.: PCT/JP2006/316467
§ 371 (c)(1),
(2), (4) Date: Feb. 20, 2008

(87) PCT Pub. No.: WO2007/023838
PCT Pub. Date: Mar. 1, 2007

(65) Prior Publication Data
US 2009/0153084 A1    Jun. 18, 2009

(30) Foreign Application Priority Data

Aug. 26, 2005    (JP) .................................. 2005-245973

(51) Int. Cl.
*H03K 5/00* (2006.01)
(52) U.S. Cl. ............... 318/400.13; 318/778; 318/400.04
(58) Field of Classification Search ............. 318/400.13, 318/778, 400.04, 400.21, 400.28, 701, 727, 318/799, 719; 324/166
See application file for complete search history.

(56) References Cited

U.S. PATENT DOCUMENTS

| | | | |
|---|---|---|---|
| 2003/0038623 A1* | 2/2003 | Draxelmayr | ................. 324/166 |
| 2004/0135529 A1 | 7/2004 | Yoshitomi et al. | |
| 2005/0052147 A1 | 3/2005 | Yoshitomi et al. | |

FOREIGN PATENT DOCUMENTS

| | | |
|---|---|---|
| JP | 7-87775 A | 3/1995 |
| JP | 10-108490 A | 4/1998 |
| JP | 2004-153921 A | 5/2004 |
| JP | 2004-153955 A | 5/2004 |

OTHER PUBLICATIONS

International Search Report for International Application No. PCT/JP2006/316467 mailed Nov. 28, 2006.
Written Opinion of the International Searching Authority for PCT/JP2006/316467 mailed Nov. 28, 2006.
Office Action for Chinese Patent Application No. 200680028137.1 issued Sep. 11, 2009 with English translation.

* cited by examiner

*Primary Examiner* — Karen Masih
(74) *Attorney, Agent, or Firm* — Cantor Colburn LLP (57) ABSTRACT

In the motor drive apparatus, a Hall element outputs a first sinusoidal signal and a second sinusoidal signal, of mutually opposite phases, in accordance with rotor position. A hysteresis comparator compares the first sinusoidal signal and the second sinusoidal signal outputted from the Hall element, and outputs a rectangular wave signal. A pulse width modulation signal generation circuit detects timing at which phase switches, based on the first sinusoidal signal and the second sinusoidal signal outputted from the Hall element, and outputs a pulse width modulation signal in which duty ratio gradually changes, in a predetermined time-period in which the phase switches. A drive circuit combines the rectangular wave signal and the pulse width modulation signal by a logical operation, and drives the fan motor.

9 Claims, 4 Drawing Sheets

MOTOR DRIVE DEVICE, METHOD, AND COOLING DEVICE USING THE SAME

CROSS REFERENCE TO RELATED APPLICATIONS

This is a U.S. national stage of application No. PCT/JP2006/316467, filed on 23 Aug. 2006. Priority under 35 U.S.C. §119(a) and 35 U.S.C. §365(b) is claimed from Japanese Application No. 2005-245973, filed 26 Aug. 2005, the disclosure of which is also incorporated herein by reference.

BACKGROUND OF THE INVENTION

1. Field of the Invention

The present invention relates to a motor drive apparatus using a Hall element.

2. Description of the Related Art

As a method of driving a single-phase motor, a method is known in which rotor position is detected using a Hall element, and coil current is controlled by applying voltage to a coil of the single-phase motor in accordance with rotor position information, to control rotation of the rotor (Patent Document 1).

Conventionally, as described in FIG. 1 of Patent Document 1, an output signal of the Hall element is inputted to a hysteresis comparator and converted to a rectangular wave signal, and the coil of the motor is energized to perform rotation control, by turning ON and OFF transistors forming a H-bridge circuit based on the rectangular wave signal. At this time, at timing in which phase is shifted, by delaying the rectangular wave signal outputted from the hysteresis comparator, a time-period (referred to below as dead time) is arranged, in which, among the transistors forming the H-bridge circuit, two transistors connected in series between a power supply and ground are both OFF. As a result, when the phase is switched, flow of breakthrough current in transistors forming the H-bridge circuit is inhibited.

Patent Document 1: Japanese Patent Application, Laid Open No. H7-87775

In cases in which a motor is driven with a dead time interval, as in technology described in Patent Document 1, during a dead time period, regenerative current flows via a freewheel diode arranged in parallel to a transistor forming the H-bridge circuit.

However, with the technology described in Patent Document 1, there have been cases in which time waveform of the regenerative current flowing via the freewheel diode changes rapidly, or has a large peak. As a result, there has been a risk of a large noise being generated, or of a large voltage being applied to a transistor that forms an output circuit such as the H-bridge circuit or the like, by a reverse voltage.

SUMMARY OF THE INVENTION

The present invention has been made in view of these problems, and a general purpose thereof is to provide a motor drive apparatus that enables a coil current to be gradually changed, when a motor phase is being switched.

A motor drive apparatus in an embodiment of the present invention is provided with: a Hall element which outputs a first sinusoidal signal and a second sinusoidal signal of mutually opposite phases, in accordance with rotor position; a first comparator which compares the first sinusoidal signal and the second sinusoidal signal outputted from the Hall element and outputs a rectangular wave signal; a pulse width modulation signal generation circuit which detects timing of phase switching, based on the first sinusoidal signal and the second sinusoidal signal outputted from the Hall element, and outputs a pulse width modulation signal whose duty ratio gradually changes, in a predetermined time-period in which phase switches; and a drive circuit which combines the rectangular wave signal and the pulse width modulation signal by a logical operation, to drive a motor that is to be driven.

According to this embodiment, since an energization time-period is controlled based on the pulse width modulation signal in which the duty ratio changes gradually, at timing at which the phase switches, it is possible to gradually change coil current.

The pulse width modulation signal generation circuit may include an amplifier which amplifies difference between the first sinusoidal signal and the second sinusoidal signal outputted from the Hall element, and outputs the difference as an absolute value signal, and a pulse width modulation comparator which compares the absolute value signal outputted from the amplifier with a cyclic voltage, and outputs the pulse width modulation signal.

In such cases, the absolute value signal is a cyclic signal with a minimum value at the timing at which the phase switches (referred to below as zero-cross). The pulse width modulation comparator, by comparing this absolute value signal with the cyclic voltage, which has a triangular waveform or a sawtooth waveform, can generate the pulse width modulation signal in which the duty ratio gradually changes, in a time-period in which the phase switches.

The amplifier may be configured such that gain therein is adjustable by an external resistor. By changing the gain in the amplifier, it is possible to adjust the length of a predetermined time-period in which the phase switches.

The drive circuit may include a H-bridge circuit as an output stage. The drive circuit may drive a low side switch based on the rectangular wave signal, and in addition may drive a high side switch based on the pulse width modulation signal.

The abovementioned motor drive circuit may be further provided with a temperature detection circuit which generates a temperature detection voltage that depends on temperature, and a second comparator which generates a temperature pulse width modulation signal in which duty ratio changes, based on a result of comparing the temperature detection voltage and the cyclic voltage, and the drive circuit may combine the temperature pulse width modulation signal, the pulse width modulation signal, and the rectangular wave signal, by a logical operation. In such cases, it is possible to realize control of a motor, which reflects temperature.

The abovementioned motor drive circuit may be further provided with a smoothing circuit which smoothes a pulse width modulated control signal that controls the rotational frequency of a motor that is to be driven, and outputs the pulse width modulated control signal as a rotation control voltage, and a third comparator which generates a rotation control pulse width modulation signal in which duty ratio changes, based on a result of comparing the rotation control voltage and the cyclic voltage; and the drive circuit may combine the rotation control pulse width modulation signal, the pulse width modulation signal, and the rectangular wave signal, by a logical operation.

The smoothing circuit may include a transistor in which the control signal is inputted to a base and which has a grounded emitter; a capacitor connected between a collector of the transistor and ground; and a resistor, one end of which is connected to the collector of the transistor, and a predetermined voltage being applied to the other end; wherein a signal occurring at the collector of the transistor may be outputted as a rotation control voltage.

In such cases, it is possible to reflect a control signal inputted from the outside, in control of the motor.

The abovementioned motor drive apparatus may be monolithically integrated on one semiconductor substrate. Furthermore, "monolithically integrated" includes cases in which all circuit component elements are formed on the semiconductor substrate, and cases in which main circuit component elements are integrated as a unit and some resistors, capacitors, or the like, for adjusting a circuit constant, may be arranged outside the semiconductor substrate. By integrating the motor drive apparatus on one LSI, it is possible to reduce circuit area.

Another embodiment of the invention is a cooling system. This system is provided with a fan motor, and the abovementioned motor drive apparatus, which drives the fan motor. According to this embodiment, by gradually changing current flowing in the motor, it is possible to reduce noise generated by the fan motor.

A further embodiment of the invention is an electronic device. The electronic device is provided with the abovementioned cooling system. According to this embodiment, noise generated by the electronic device is reduced.

An even further embodiment of the invention is a motor driving method. The method includes the steps of: outputting a first and a second sinusoidal signal of mutually opposite phases, in accordance with rotor position; comparing the first sinusoidal signal and the second sinusoidal signal and outputting a rectangular wave signal; detecting timing of phase switching, based on the first and the second sinusoidal signals, and generating a pulse width modulation signal whose duty ratio gradually changes, in a predetermined time-period in which phase switches; and combining the rectangular wave signal and the pulse width modulation signal by a logical operation, to drive the motor that is to be driven.

According to this embodiment, since an energization period is controlled based on the pulse width modulation signal in which the duty ratio changes gradually, at a timing at which the phase switches, it is possible to gradually change regenerative current flowing in the coil.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

Figure 1:
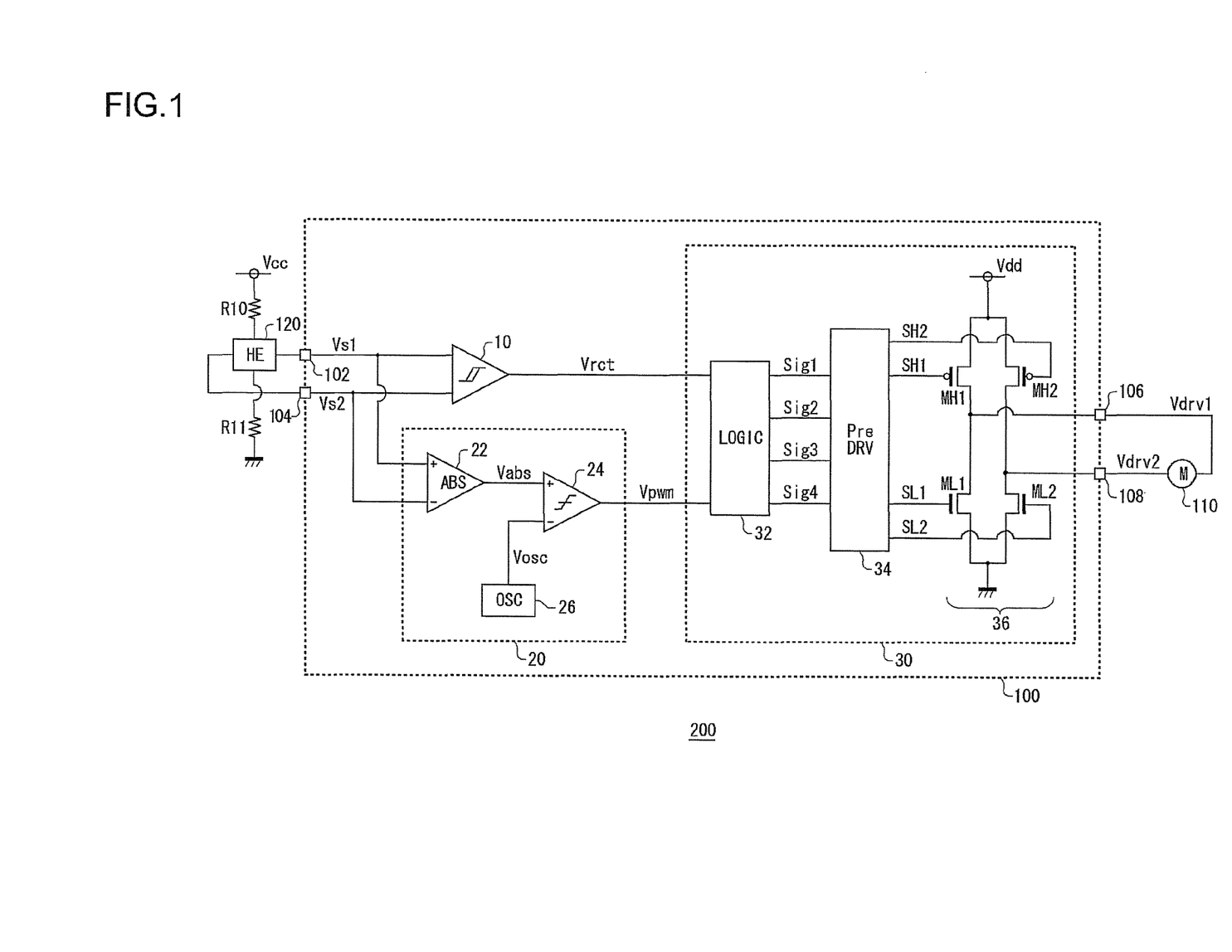
FIG. 1 is a circuit diagram showing a configuration of a cooling system according to a first embodiment.

In an embodiment of the invention, an explanation is given concerning a motor drive apparatus used in a cooling system for cooling an electronic device such as a refrigerator, a personal computer, or the like. FIG. 1 is a circuit diagram showing a configuration of the cooling system 200 according to a first embodiment of the invention. The cooling system 200 includes a motor drive apparatus 100, a fan motor 110, and a Hall element 120.

The fan motor 110 is a single-phase full-wave motor, and is disposed opposite an object that is to be cooled, which is not shown in the figure. In the fan motor 110, a coil current, that is, an energization state, is controlled by a drive voltage outputted from the motor drive apparatus 100, and rotation is controlled.

The Hall element 120 is connected to a power supply line, to which a power supply voltage Vcc is applied via a resistor R10, and is grounded via a resistor R11. The size of a signal outputted from the Hall element 120 is adjusted by the resistor R10 and the resistor R11. Therefore, either one or both of the resistor R10 and the resistor R11 may be a shorted, according to a same-phase input range of a hysteresis comparator 10 and an amplifier 22.

The Hall element 120 outputs a first sinusoidal signal Vs1 and a second sinusoidal signal Vs2, in accordance with rotor position of the fan motor 110. The first sinusoidal signal Vs1 and the second sinusoidal signal Vs2 are of mutually opposite phases, and a cycle is a sinusoidal wave that changes in accordance with the rotational frequency of the fan motor 110. The power supply voltage Vcc is applied via the resistor R10 to the Hall element 120. The amplitudes of the first sinusoidal signal Vs1 and the second sinusoidal signal Vs2 outputted from the Hall element 120 are adjustable by the resistor R10.

The motor drive apparatus 100 drives the fan motor 110 based on the first sinusoidal signal Vs1 and the second sinusoidal signal Vs2 outputted from the Hall element 120. The motor drive apparatus 100 is a function IC which is monolithically integrated on one semiconductor substrate. As terminals for input and output of signals, the motor drive apparatus 100 is provided with a first input terminal 102 and a second input terminal 104 to which the first sinusoidal signal Vs1 and the second sinusoidal signal Vs2 are respectively inputted, and a first output terminal 106 and a second output terminal 108 from which a first drive voltage Vdrv1 and a second drive voltage Vdrw2 for driving the fan motor 110 are respectively outputted.

The motor drive apparatus 100 includes a hysteresis comparator 10, a pulse width modulation signal generation circuit 20, and a drive circuit 30. The hysteresis comparator 10 compares the first sinusoidal signal Vs1 and the second sinusoidal signal Vs2 outputted from the Hall element 120, and outputs a rectangular wave signal Vrct, at a high level when Vs1>Vs2, and at a low level when Vs1<Vs2.

The pulse width modulation signal generation circuit detects timing at which the phase of the fan motor 110 switches, based on the first sinusoidal signal Vs1 and the second sinusoidal signal Vs2 outputted from the Hall element 120, and outputs a pulse width modulation signal Vpwm in which duty ratio gradually changes, in a predetermined time-period in which the phase switches.

The pulse width modulation signal generation circuit 20 includes the amplifier 22, a pulse width modulation comparator (referred to below as PWM comparator) 24, and an oscillator 26. The amplifier 22 amplifies the different between the first sinusoidal signal Vs1 and the second sinusoidal signal Vs2 outputted from the Hall element 120, and outputs the difference as an absolute value signal Vabs. The oscillator 26 outputs a cyclic voltage Vosc of a triangular waveform or a sawtooth waveform. The frequency of the cyclic voltage Vosc generated by the oscillator 26 is preferably set to be sufficiently high with respect to the rotational frequency of the fan motor 110, for example, about several dozen kHz, or more specifically, about 10 kHz to 40 kHz.

The PWM comparator 24 compares the absolute value signal Vabs outputted from the amplifier 22, with the cyclic voltage Vosc, and outputs the pulse width modulation signal Vpwm, which has a high level when Vabs>Vosc, and a low level when Vabs<Vosc. This pulse width modulation signal Vpwm is a pulse width modulated signal, for which a high level and a low level time-period change in accordance with voltage value of the absolute value signal Vabs, at a constant frequency.

The rectangular wave signal Vrct outputted from the hysteresis comparator 10, and the pulse width modulation signal Vpwm outputted from the pulse width modulation signal generation circuit 20 are inputted to the drive circuit 30. The drive circuit 30 combines the rectangular wave signal Vrct and the pulse width modulation signal Vpwm, by a logical operation, and drives the fan motor 110.

The drive circuit 30 includes a logic circuit 32, a pre-drive circuit 34, and a H-bridge circuit 36. The logic circuit 32 combines the rectangular wave signal Vrct and the pulse width modulation signal Vpwm, by a logical operation. The logic circuit 32 outputs a signal that is the rectangular wave signal Vrct logically inverted, as a first signal Sig1, and the rectangular wave signal Vrct as a second signal Sig2 to the pre-driver circuit 34 at a later stage. Furthermore, the logic circuit 32 outputs a logical product (Vrct ∧ Vpwm) of the pulse width modulation signal Vpwm and the rectangular wave signal Vrct as a third signal Sig3, and an inverted signal of a logical product (*Vrct ∧ Vpwm) of the pulse width modulation signal Vpwm and the rectangular wave signal Vrct as a fourth signal Sig4. In the present specification, the symbol * attached to respective signals indicates logical inversion.

The H-bridge circuit 36, which is an output stage of the drive circuit 30, includes a first high side switch MH1, a second high side switch MH2, a first low side switch ML1, and a second low side switch ML2. The first high side switch MH1 and the second high side switch MH2, are P-channel MOSFETs (Metal Oxide Semiconductor Field Effect Transistors), and the first low side switch ML1 and the second low side switch ML2 are N-channel MOSFETs.

The first high side switch MH1 and the first low side switch ML1 are connected in series between ground and a power supply line to which a power supply voltage Vdd is applied. The voltage of a connection point of the first high side switch MH1 and the first low side switch ML1 is applied to one end of the fan motor 110, as a first drive voltage Vdrv1, via the first output terminal 106. ON/OFF states of the first high side switch MH1 and the first low side switch ML1 are controlled by gate control signals SH1 and SL1 inputted to respective gates. That is, the first high side switch MH1 is ON when the gate control signal SH1 has a low level, and is OFF when the gate control signal SH1 has a high level. Moreover, the first low side switch ML1 is ON when the gate control signal SH1 has a high level, and is OFF when the gate control signal SH1 has a low level.

The first drive voltage Vdrv1 applied to the fan motor 110 is the power supply voltage Vdd when the first high side switch MH1 is ON and the first low side switch ML1 is OFF, and is ground potential 0V when the first high side switch MH1 is OFF, and the first low side switch ML1 is ON.

In the same way, the second high side switch MH2 and the second low side switch ML2 are connected in series between ground and the power supply line. The voltage of a connection point of the second high side switch MH2 and the second low side switch ML2 is applied to the other end of the fan motor 110, as a second drive voltage Vdrv2, via the second output terminal 108.

The pre-driver circuit 34 generates the gate control signals SH1, SH2, SL1, and SL2, based on the first signal Sig1 to the fourth signal Sig4, outputted from the logic circuit 32. In the present embodiment, SL1=Sig1, SL2=Sig2, SH1=*Sig3, and SH2=*Sig4. That is, in the embodiment, the pre-driver circuit 34 alternately turns ON and OFF and drives the first low side switch ML1 and the second low side switch ML2, based on the rectangular wave signal Vrct. Moreover, the pre-driver circuit 34 alternately turns ON and OFF and drives the first high side switch MH1 and the second high side switch MH2, based on a logical product of the pulse width modulation signal Vpwm and the rectangular wave signal Vrct.

Figure 2:
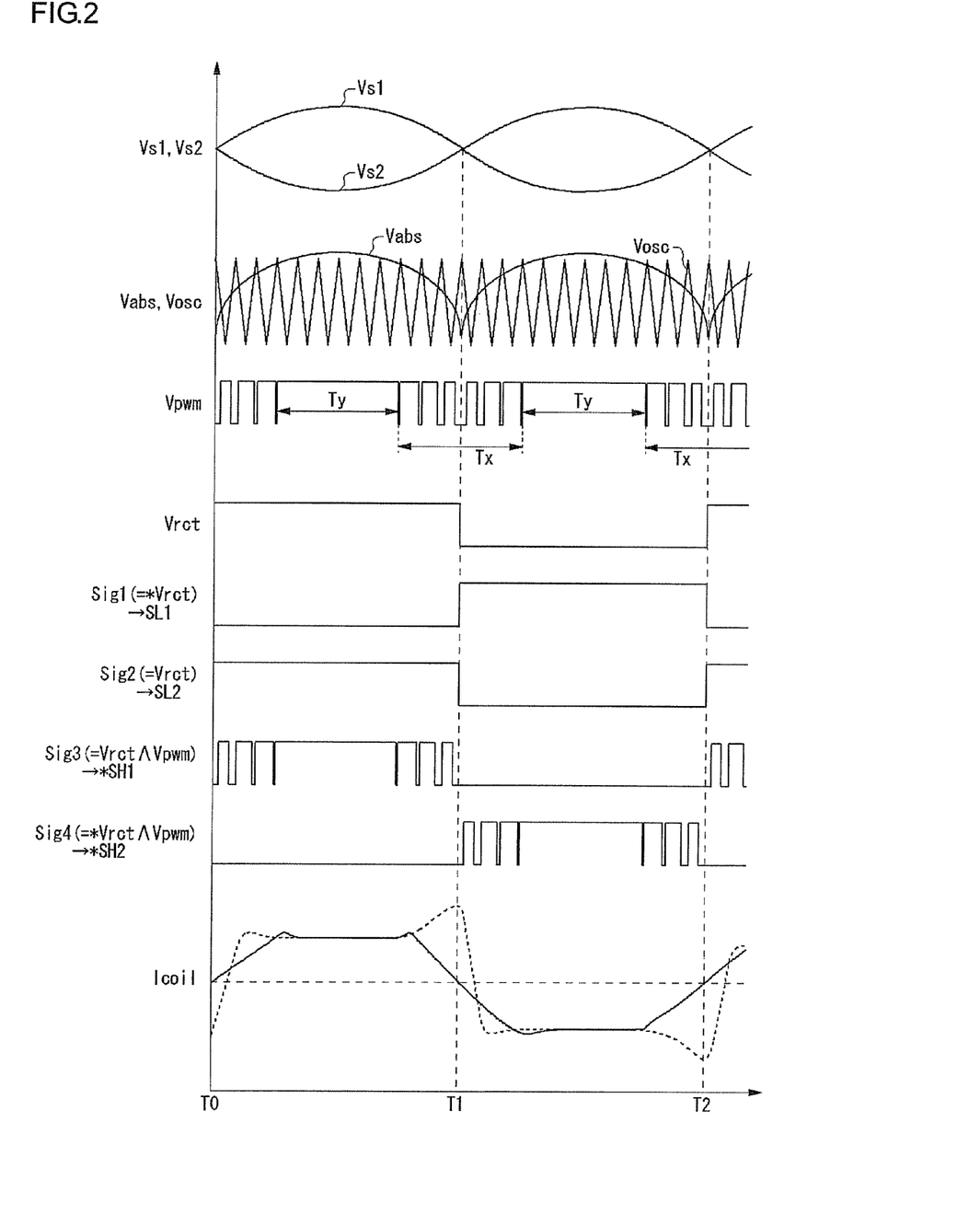
FIG. 2 is a time chart showing an operation state of the cooling system of FIG. 1.

An explanation will be given concerning operation of the cooling system 200 configured as above, based on FIG. 2. FIG. 2 is a time chart showing an operation state of the cooling system of FIG. 1. The time chart of FIG. 2 shows, from the top, in order, the first sinusoidal signal Vs1 and the second sinusoidal signal Vs2, the absolute value signal Vabs and the cyclic voltage Vosc, the pulse width modulation signal Vpwm, the rectangular wave signal Vrct, the first signal Sig1 to the fourth signal Sig4, and the coil current Icoil. Furthermore, in the same figure, in order to make the explanation concise, the vertical axis and horizontal axis are expanded and contracted as appropriate.

The first sinusoidal signal Vs1 and the second sinusoidal signal Vs2, of mutually inverse phases, in accordance with the rotor position, are outputted from the Hall element 120. The rectangular wave signal Vrct outputted from the hysteresis comparator 10 has a high level when Vs1>Vs2, and has a low level when Vs1<Vs2.

The absolute value signal Vabs outputted from the amplifier 22 is obtained by amplifying the difference |Vs1−Vs2| between the first sinusoidal signal Vs1 and the second sinusoidal signal Vs2, to become a voltage in which a direct current component and a component proportional to |Vs1−Vs2| are superimposed. As a result, the absolute value signal Vabs has a minimum value at timing at which the phase switches, as shown in FIG. 2. The pulse width modulation signal Vpwm outputted from the PWM comparator 24 has a high level when Vabs>Vosc, and has a low level when Vabs<Vosc. Below, a time-period in which the pulse width modulation signal Vpwm repeatedly has a high level and a low level, in accordance with frequency of the cyclic voltage Vosc, is referred to as a soft start time-period (equivalent to Tx in FIG. 2), and a time-period in which the pulse width modulation signal Vpwm is steady at a high level or a low level is referred to as an energization time-period (equivalent to Ty in the figure).

The pulse width modulation signal Vpwm has a low level for a longest time-period at phase switch timing (zero cross point) at which the absolute value signal Vabs is smallest, in the soft start time-period, and with the zero cross point as center, the low level time-period gradually becomes shorter.

As described above, the first signal Sig1 generated by the logic circuit 32, is a signal that is the rectangular wave signal Vrct inverted, and the second signal Sig2 has the same level of the rectangular wave signal Vrct. Furthermore, the third signal Sig3 is a logical product of the rectangular wave signal Vrct and the pulse width modulation signal Vpwm, and the fourth signal Sig4 is a logical product of the rectangular wave signal Vrct inverted and the pulse width modulation signal Vpwm. Therefore, time-periods in which the third signal Sig3 and the fourth signal Sig4 have a high level gradually become longer from respective zero cross points.

The first high side switch MH1 is ON when the gate control signal SH1 has a low level, and is OFF when the gate control signal SH1 has a high level (that is, ON when the third signal Sig3 has a high level, and OFF when the third signal Sig3 has a low level); and the second low side switch ML2 is ON when the gate control signal SL2 has a high level, and is OFF when the gate control signal SL2 has a low level. Therefore, in the time-period of time T0 to T1 in FIG. 2, in a state in which the second low side switch ML2 is ON, the first high side switch MH1 repeatedly turns ON and OFF in accordance with a pulse width signal. At this time, the coil current Icoil flows in a direction from the first output terminal 106 of the motor drive apparatus 100 towards the second output terminal 108.

In the same way, the first low side switch ML1 is ON when the gate control signal SH1 has a high level, and is OFF when the gate control signal SH1 has a low level, and the second high side switch MH2 is ON when the gate control signal SH2 has a low level, and is OFF when the gate control signal SH2 has a high level (that is, ON when the fourth signal Sig4 has a high level, and OFF when the fourth signal Sig4 has a low level). Therefore, in a time-period from time T1 to T2, in a state in which the first low side switch ML1 is ON, the second high side switch MH2 repeatedly turns ON and OFF in accordance with a pulse width signal. At this time, the coil current Icoil flows in a direction from the second output terminal 108 of the motor drive apparatus 100 towards the first output terminal 106.

As described above, according to the motor drive apparatus 100 according to the present embodiment, by driving the fan motor 110 based on the pulse width modulation signal Vpwm, at timing in which the phase switches, the coil current Icoil changes gradually, as shown by the solid line in FIG. 2. As a result, generation of noise is reduced, and it is possible to inhibit a peak of the coil current Icoil.

In order to clarify an effect of the motor drive apparatus 100 according to the present embodiment, at timing in which the phase switches, a time waveform of the coil current Icoil, in cases in which the fan motor 110 is driven without using the pulse width modulation signal, is shown by a dashed line. In cases in which all transistors MH1, MH2, ML1, and ML2 forming the H-bridge circuit 36 are OFF, at timing in which the phase switches, without using the pulse width modulation signal, the coil current Icoil flows via a flywheel diode, not shown in the figure. In a non-energization time-period in which all the transistors are OFF, since control of the coil current Icoil is not possible, the coil current Icoil has a peak, as shown by a dashed like in FIG. 2. When the coil current Icoil flows via the flywheel diode towards the power supply line, there are cases in which a very large voltage is applied to a transistor forming the H-bridge circuit 36, and device reliability is affected.

According to the motor drive apparatus 100 according to the present embodiment, it is possible to preferably solve such problems.

Second Embodiment

Figure 3:
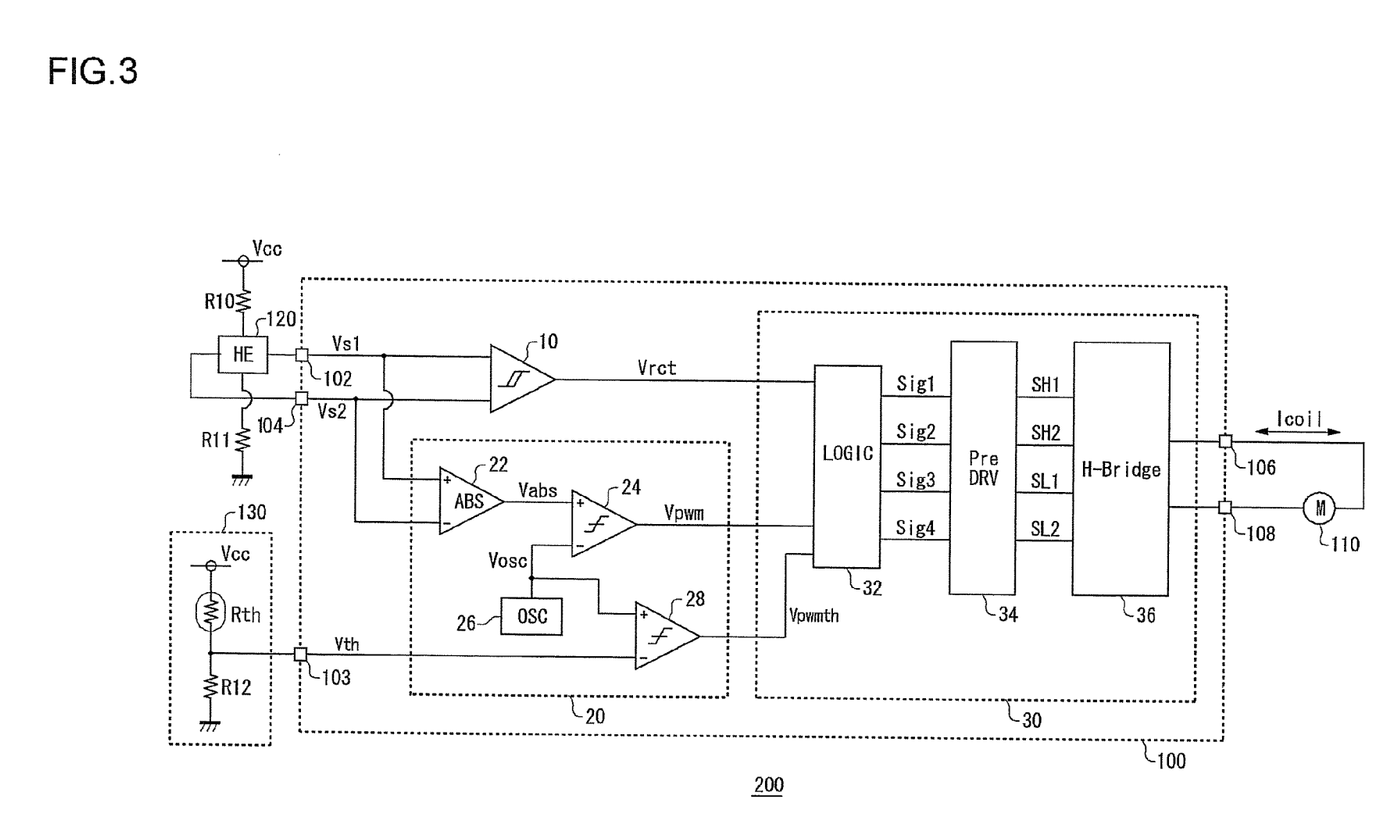
FIG. 3 is a circuit diagram showing a configuration of a cooling system according to a second embodiment.

In the first embodiment, an explanation was given concerning cases in which a single phase motor is driven linearly, for the energization time-period; in a second embodiment as below, however, an explanation is given concerning cases in which a single phase motor is driven by switching. FIG. 3 is a circuit diagram showing a configuration of a cooling system 200 according to the second embodiment. In FIG. 3, component elements that are identical or equivalent to component elements in the configuration of FIG. 1 are given the same reference symbols, and repeated explanations are omitted as appropriate.

A temperature detection circuit 130, which generates a temperature detection voltage Vth that is dependent on surrounding temperature of an object to be cooled, is connected to an external portion of the motor drive apparatus 100. The temperature detection circuit 130 includes a thermistor Rth and a resistor R12 connected in series between a reference voltage and ground. Voltage at a connection point of the thermistor Rth and the resistor R12 is inputted to a control terminal 103 of the motor drive apparatus 100, as a temperature detection voltage Vth. The temperature detection voltage Vth is inputted, together with a first sinusoidal signal Vs1 and a second sinusoidal signal Vs2 outputted from a Hall element 120, to a pulse width modulation signal generation circuit 20.

The pulse width modulation signal generation circuit 20 includes a comparator 28, which compares the temperature detection voltage Vth and a cyclic voltage Vosc outputted from an oscillator 26. The comparator 28 generates a temperature pulse width modulation signal Vpwmth which has a high level when Vosc>Vth, and a low level when Vosc<Vth. The temperature pulse width modulation signal Vpwmth is outputted to a drive circuit 30.

The drive circuit 30 combines the temperature pulse width modulation signal Vpwmth, the pulse width modulation signal Vpwm outputted from the PWM comparator 24, and the rectangular wave signal Vrct, by a logical operation, and drives the fan motor 110. With a logical product of the pulse width modulation signal Vpwm outputted from the PWM comparator 24 and the temperature pulse width modulation signal Vpwmth outputted from the comparator 28, as a pulse width modulation signal Vpwm', the logic circuit 32 generates a first signal Sig1 to a fourth signal Sig4 by a logical operation on the pulse width modulation signal Vpwm' and the rectangular wave signal Vrct. The combination of the pulse width modulation signal Vpwm' and the rectangular wave signal Vrct may be performed similarly to the combination of the pulse width modulation signal vpwm and the rectangular wave signal Vrct of the first embodiment.

According to the motor drive apparatus 100 according to the second embodiment configured as above, it is possible to reflect temperature in rotation control of the fan motor 110.

Third Embodiment

Figure 4:
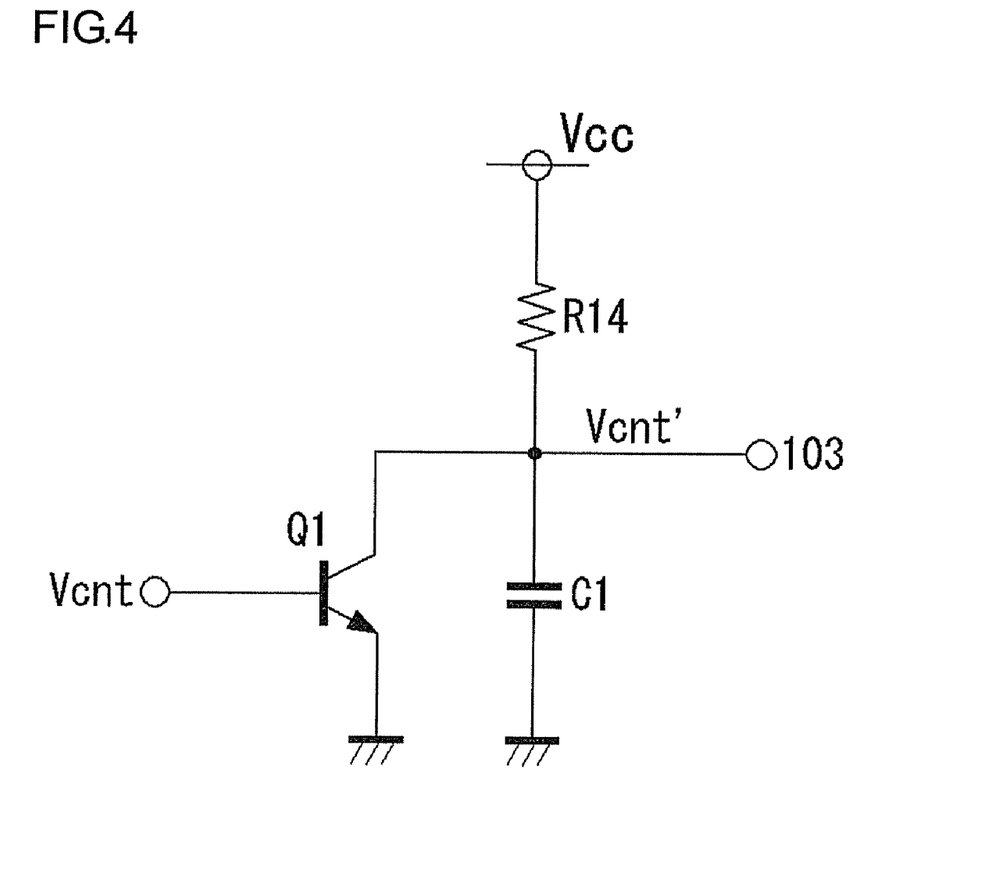
FIG. 4 is a circuit diagram showing a configuration of a smoothing circuit of a cooling system according to a third embodiment.

In a third embodiment, an explanation is given concerning a cooling system 200 that controls a fan motor 110 based not on temperature, but on a pulse width modulated control signal Vcnt which controls the rotational frequency of a fan motor 110 that is to be driven. In the present embodiment, a motor drive apparatus 100 has a configuration similar to FIG. 3, and is provided with a smoothing circuit 140, instead of the temperature detection circuit 130. FIG. 4 is a circuit diagram showing a configuration of the smoothing circuit 140 of the cooling system 200 according to the third embodiment.

The smoothing circuit 140 smoothes the pulse width modulated control signal Vcnt which controls the rotational frequency of the fan motor 110, and outputs a result thereof as a direct current rotation control voltage Vcnt'.

The smoothing circuit 140 includes a transistor Q1, a capacitor C1, and a resistor R14. The control signal Vcnt is inputted to a base of the transistor Q1, an emitter of which is grounded. The capacitor C1 is connected between a collector of the transistor Q1 and ground. A voltage that occurs at a collector of the transistor Q1 is inputted as a rotation control voltage Vcnt' to a control terminal 103 of the motor drive apparatus 100.

According to the cooling system 200 according to the present embodiment, it is possible to perform rotation control of the fan motor 110 according to a duty ratio of the control signal Vcnt inputted from outside. That is, the rotation control voltage Vcnt', whose voltage value becomes lower, the larger the duty ratio of the control signal Vcnt is, is outputted from the smoothing circuit 140 of FIG. 4. When the rotation control voltage Vcnt' becomes lower, since duty ratio of the temperature pulse width modulation signal Vpwmth outputted from the comparator 28 becomes larger, it is possible to make the fan motor 110 rotate at a high rotation speed.

The abovementioned embodiments are examples, and a person skilled in the art will understand that various modified examples in combinations of various component elements and various processes thereof are possible, and that such modified examples are within the scope of the present invention.

In the first to the third embodiments described above, the amplifier 22 may be configured so that its gain can be adjusted by an external resistor. By adjusting the gain of the amplifier 22, it is possible to control the size of the absolute value signal Vabs. In cases in which the gain of the amplifier 22 is enlarged, since the absolute value signal Vabs shown in FIG. 2 is shifted to a high potential side, the excitation time-period Ty becomes long, and in addition, a soft start time-period Tx becomes short. Conversely, in cases in which the gain of the amplifier 22 is made small, since the absolute value signal Vabs shown in FIG. 2 is shifted to a low potential side, the excitation time-period Ty becomes short, and in addition, a soft start time-period Tx becomes long.

In the embodiments, explanations have been given concerning cases in which the motor drive apparatus 100 drives a single phase full-wave motor, but there is no limitation thereto. For a multiphase motor also, by arranging a soft start time-period at timing in which the phase switches, and generating a pulse width modulation signal to perform driving, it is possible to gradually change coil current.

In the embodiments, explanations have been given concerning cases in which the motor drive apparatus 100 is integrated as a unit on one LSI, but there is no limitation thereto, and part of the component elements may be arranged outside the LSI as discrete elements or as chip parts, or a configuration may be made of a plurality of LSIs. For example, the H-bridge circuit 36 of the drive circuit 30 may be configured using discrete power transistors.

In the embodiments, among the transistors forming the H-bridge circuit 36, the low side switch is driven based on the rectangular wave signal Vrct, and the high side switch is driven based on the pulse width modulation signal Vpwm and the rectangular wave signal Vrct, but the present invention is not limited thereto. For example, the pre-driver circuit 34 may drive both the high side switch and the low side switch based on the pulse width modulation signal Vpwm and the rectangular wave signal Vrct. That is, the gate control signal SL1 may be taken as the fourth signal Sig4, and the gate control signal SL2 may be taken as the third signal Sig3.

Furthermore, with regard to the transistors used in the embodiments, bipolar transistors and FETs may be mutually exchanged.

Setting of logical values at a high level and a low level, which was explained in the embodiments, is an example, and changes can be freely made by carrying out appropriate inversion by an inverter or the like.

While the preferred embodiments of the present invention have been described using specific terms, such description is for illustrative purposes only, and it is to be understood that changes and variations may be made without departing from the spirit or scope of the appended claims.

The invention claimed is:

1. A motor drive apparatus comprising:
   a Hall element which outputs a first and a second sinusoidal signal of mutually opposite phases, in accordance with rotor position;
   a first comparator which compares the first sinusoidal signal and the second sinusoidal signal outputted from the Hall element and outputs a rectangular wave signal;
   a pulse width modulation signal generation circuit which detects timing of phase switching, based on the first sinusoidal signal and the second sinusoidal signal outputted from the Hall element, and outputs a pulse width modulation signal whose duty ratio gradually changes, in a predetermined time-period in which phase switches; and
   a drive circuit which combines the rectangular wave signal and the pulse width modulation signal, by a logical operation, to drive a motor that is to be driven, wherein the pulse width modulation signal generation circuit comprises:
   an amplifier which amplifies difference between the first sinusoidal signal and the second sinusoidal signal outputted from the Hall element, and outputs the difference as an absolute value signal; and
   a pulse width modulation comparator which compares the absolute value signal outputted from the amplifier with a cyclic voltage, and outputs a pulse width modulation signal;
   wherein the duty ratio reaches a minimum level at a time of phase switching.

2. The motor drive apparatus according to claim 1, wherein the amplifier is configured such that gain of the amplifier is adjustable by an external resistor.

3. The motor drive apparatus according to claim 1, wherein the drive circuit comprises a H-bridge circuit as an output stage, and drives a low side switch based on the rectangular wave signal, and drives a high side switch based on the pulse width modulation signal.

4. The motor drive apparatus according to claim 1, further comprising:
   a temperature detection circuit which generates a temperature detection voltage that depends on temperature; and
   a second comparator which generates a temperature pulse width modulation signal in which duty ratio changes, based on a result of comparing the temperature detection voltage and the cyclic voltage; wherein
   the drive circuit combines the temperature pulse width modulation signal, the pulse width modulation signal, and the rectangular wave signal, by a logical operation.

5. The motor drive apparatus according to claim 1, further comprising:
   a smoothing circuit which smoothes a pulse width modulated control signal that controls rotational frequency of a motor that is to be driven, and outputs the pulse width modulated control signal as a rotation control voltage; and a third comparator which generates a rotation control pulse width modulation signal in which duty ratio changes, based on a result of comparing the rotation control voltage and the cyclic voltage; wherein the drive circuit combines the rotation control pulse width modulation signal, the pulse width modulation signal, and the rectangular wave signal, by a logical operation.

6. The motor drive apparatus according to claim 5, wherein the smoothing circuit comprises:

a transistor in which the control signal is inputted to a base and which has a grounded emitter;

a capacitor connected between a collector of the transistor and ground; and a resistor, one end of which is connected to the collector of the transistor, a predetermined voltage being applied to the other end; wherein a signal occurring at the collector of the transistor is outputted as a rotation control voltage.

7. The motor drive apparatus according to claim 1, wherein the motor drive apparatus is monolithically integrated on one semiconductor substrate.

8. A cooling system comprising:

a fan motor; and the motor drive apparatus according to claim 1, which drives the fan motor.

9. A motor drive method comprising:

outputting a first and a second sinusoidal signal of mutually opposite phases, in accordance with rotor position;

comparing the first sinusoidal signal and the second sinusoidal signal and outputting a rectangular wave signal;

detecting timing of phase switching, based on the first and the second sinusoidal signals, and generating a pulse width modulation signal whose duty ratio gradually changes, in a predetermined time-period in which phase switches; generating an absolute value signal by amplifying difference between the first sinusoidal signal and the second sinusoidal signal;

generating a pulse width modulation signal by comparing the absolute value signal with a cyclic voltage; and combining the rectangular wave signal and the pulse width modulation signal by a logical operation, to drive the motor that is to be driven;

wherein the duty ratio reaches a minimum level at a time of phase switching.

* * * * *